(12) United States Patent
Odawara

(10) Patent No.: US 8,366,307 B2
(45) Date of Patent: Feb. 5, 2013

(54) SEMICONDUCTOR LIGHT EMITTING DEVICE

(75) Inventor: Masaki Odawara, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 429 days.

(21) Appl. No.: 12/729,503

(22) Filed: Mar. 23, 2010

(65) Prior Publication Data

US 2010/0238687 A1 Sep. 23, 2010

(30) Foreign Application Priority Data

Mar. 23, 2009 (JP) ................................. 2009-070006

(51) Int. Cl.
*F21V 7/04* (2006.01)
(52) U.S. Cl. ..... 362/612; 362/84; 362/97.3; 362/249.02
(58) Field of Classification Search .................. 362/612, 362/555, 97.3, 84, 249.02, 545, 311.02, 231, 362/800; 257/98, 99
See application file for complete search history.

(56) References Cited

U.S. PATENT DOCUMENTS

| | | | | |
|---|---|---|---|---|
| 7,926,984 | B2 * | 4/2011 | Su | 362/329 |
| 7,942,539 | B2 * | 5/2011 | Kurokawa | 362/26 |
| 8,113,699 | B2 * | 2/2012 | Tsutsumi | 362/538 |
| 2004/0202007 | A1 * | 10/2004 | Yagi et al. | 362/545 |

FOREIGN PATENT DOCUMENTS

JP 2007-59612 A 3/2007

* cited by examiner

*Primary Examiner* — Bao Q Truong
(74) *Attorney, Agent, or Firm* — Kenealy Vaidya LLP

(57) ABSTRACT

A semiconductor light emitting device of what is called a side view type can achieve directional characteristics having substantial symmetry with respect to an optical axis. The semiconductor light emitting device can emit light in a direction substantially parallel to a surface on which the semiconductor light emitting device is to be held. The semiconductor light emitting device can include a semiconductor light emitting element emitting light in a light emitting direction parallel to the surface on which the semiconductor light emitting element is to be held, a base substrate having a main surface on which the semiconductor light emitting device is held, the main surface being parallel to the surface on which the semiconductor light emitting device is to be held. The base substrate can have a cutoff portion defined forward of the semiconductor light emitting element in the light emitting direction and in a position in which light emitted from the semiconductor light emitting element crosses the main surface. A light-transmitting first sealing resin can be provided on the base substrate, to bury the semiconductor light emitting element while filling the cutoff portion. The light emitted from the semiconductor light emitting element can travel through the cutoff portion.

24 Claims, 8 Drawing Sheets

SEMICONDUCTOR LIGHT EMITTING DEVICE

This application claims the priority benefit under 35 U.S.C. §119 of Japanese Patent Application No. 2009-070006 filed on Mar. 23, 2009, which is hereby incorporated in its entirety by reference.

BACKGROUND

1. Technical Field

The presently disclosed subject matter relates to a semiconductor light emitting device. In particular, the presently disclosed subject matter relates to a semiconductor light emitting device of what is called a side view type for emitting light mainly in a direction substantially parallel to a surface on which the semiconductor light emitting device is to be held.

2. Related Art

Backlight units used in a liquid crystal display device may include backlight units of both an edge light type and those of a direct type. Thin liquid crystal display devices incorporated in cell phones, notebook personal computers, and other devices generally employ the edge light type backlight unit. According to the edge light type backlight unit, light emitted from a light source enters a light-transmitting light guide plate through a side surface of the light guide plate. Then, the traveling direction of the light is changed by using reflection dots and the like provided on a surface of the light guide plate, so that the whole surface of the light guide plate is uniformly illuminated. This surface light emission constitutes backlight units of liquid crystal display devices.

Light sources for use in the edge light type backlight unit include light emitting diodes (LEDs) for compact liquid crystal display devices such as those used in cell phones, as well as cold-cathode tubes (CCLFs). LEDs for use in the edge light type backlight unit can be what are called side view type LEDs each having a light emitting surface extending in a direction substantially perpendicular to a surface on which an LED package is mounted.

FIG. 1 shows an exemplary structure of a conventional side view type semiconductor light emitting device. The conventional side view type semiconductor light emitting device can include a first substrate 100 with electrodes formed on its surface, an LED chip 110 mounted on the first substrate 100, a spacer 120 provided on the first substrate 100, a second substrate 130 facing the first substrate 100 with the spacer 120 interposed therebetween, and a light-transmitting resin 140 applied to fill a space defined by the first and second substrates 100 and 130 and by the spacer 120, the light-transmitting resin 140 burying the LED chip 110. (See, for example, Japanese Patent Application Laid-Open No. 2007-59612.)

The semiconductor light emitting device of the conventional structure has suffered from the deviation of directional characteristics of light emitted from a light emitting surface 300. FIG. 2 shows directional characteristics of the conventional side view type semiconductor light emitting device described above, and describes the proportion of light intensity as viewed in an angle range of θ degrees with respect to a light source when the axial light intensity is 100%. As shown in FIG. 2, light emitted from the light source does not spread symmetrically in a horizontal direction (or optical axis). Rather, the intensity of the light tends to decrease in a region below a surface on which the LED chip 110 is mounted (in a region closer to a surface 200 on which the semiconductor light emitting device is to be held), and tends to increase in a region above that surface. This is because light emitted from the LED chip 110 toward the surface 200 is reflected off a surface of the first substrate 100 as shown in FIG. 1. These directional characteristics of light reduces efficiency of light entry into a light guide plate, by which nonuniformity of brightness may be generated in the surface of the light guide plate.

SUMMARY

The presently disclosed subject matter was devised in view of these and other characteristics, features, and problems and in association with the conventional art. According to an aspect of the presently disclosed subject matter, there can be provided a semiconductor light emitting device of what is called a side view type that achieves directional characteristics having improved or substantial symmetry with respect to an optical axis.

According to another aspect of the presently disclosed subject matter, a semiconductor light emitting device can emit light in a direction substantially parallel to a surface on which the semiconductor light emitting device is to be held, and the semiconductor light emitting device can include: a semiconductor light emitting element configured to emit light in a light emitting direction parallel to the surface on which the semiconductor light emitting element is to be held; a base substrate having a main surface on which the semiconductor light emitting device is held, the main surface being parallel to the surface on which the semiconductor light emitting device is to be held, the base substrate having a cutoff portion defined forward of the semiconductor light emitting element in the light emitting direction, the cutoff portion being defined in a position in which light emitted from the semiconductor light emitting element crosses the main surface; and a light-transmitting first sealing resin provided on the base substrate, the first sealing resin configured to bury the semiconductor light emitting element while filling the cutoff portion, wherein light emitted from the semiconductor light emitting element can travel through the cutoff portion.

In the above aspect of the presently disclosed subject matter, the cutoff portion can penetrate the base substrate.

In the above aspect of the presently disclosed subject matter, the cutoff portion can have a length longer than one side of the semiconductor light emitting element.

In the above aspect of the presently disclosed subject matter, the semiconductor light emitting device can have an end face in the light emitting direction serving as a light emitting surface, and the semiconductor light emitting element can be disposed on a center axis of a light emitting region at the light emitting surface.

In the above aspect of the presently disclosed subject matter, the first sealing resin can include a wavelength conversion material.

In the above aspect of the presently disclosed subject matter, the first sealing resin can include a light scattering material.

In the above aspect of the presently disclosed subject matter, the semiconductor light emitting device can further include a second sealing resin provided on or adjacent to the first sealing resin.

In the above aspect of the presently disclosed subject matter, the second sealing resin can have a light reflectance property.

According to still another aspect of the presently disclosed subject matter, a semiconductor light emitting device can emit light in a direction substantially parallel to a surface on which the semiconductor light emitting device is to be held, and the semiconductor light emitting device can include: a semiconductor light emitting element configured to emit light in a light emitting direction parallel to the surface on which the semiconductor light emitting device is to be held; a base substrate having a top surface on which the semiconductor light emitting element is mounted, and a back surface serving as the surface on which the semiconductor light emitting device is to be held; a first sealing resin configured to seal the semiconductor light emitting element; a spacer member provided to partially surround the first sealing resin; a second sealing resin configured to cover the semiconductor light emitting element, the first sealing resin and the spacer member from above; and a light emitting surface defined by the base substrate, the spacer member and the second sealing resin, the light emitting surface extending in a direction substantially perpendicular to the surface on which the semiconductor light emitting device is to be held, wherein a cutoff portion is defined in part of an edge of the base substrate, the edge defining the light emitting surface.

According to still another aspect of the presently disclosed subject matter, a method for manufacturing the semiconductor light emitting device of the presently disclosed subject matter, can include: preparing a die pad, and a base substrate having a cutoff portion defined close to the die pad; mounting a semiconductor light emitting element onto the die pad; fixedly providing a spacer on the base substrate to surround the semiconductor light emitting element; applying a light-transmitting resin to fill a space around the semiconductor light emitting element; fixedly providing a frame member on the spacer; and applying a sealing resin to fill a space surrounded by the frame member, the light-transmitting resin, and the spacer.

The semiconductor light emitting device of the presently disclosed subject matter can achieve directional characteristics having improved or substantial symmetry in an angle range of θ degrees with respect to an optical axis as a center. Accordingly, the semiconductor light emitting device of the presently disclosed subject matter is suitably adopted for use with a light guide plate and the like for constituting a backlight unit of a liquid crystal display device.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

Figure 1:
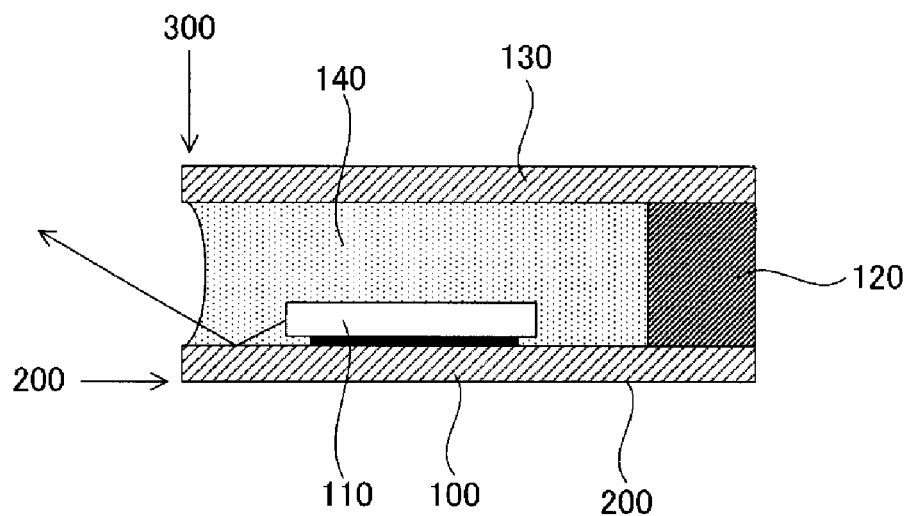
FIG. 1 is a cross sectional view illustrating the structure of a conventional side view type semiconductor light emitting device.
Figure 2:
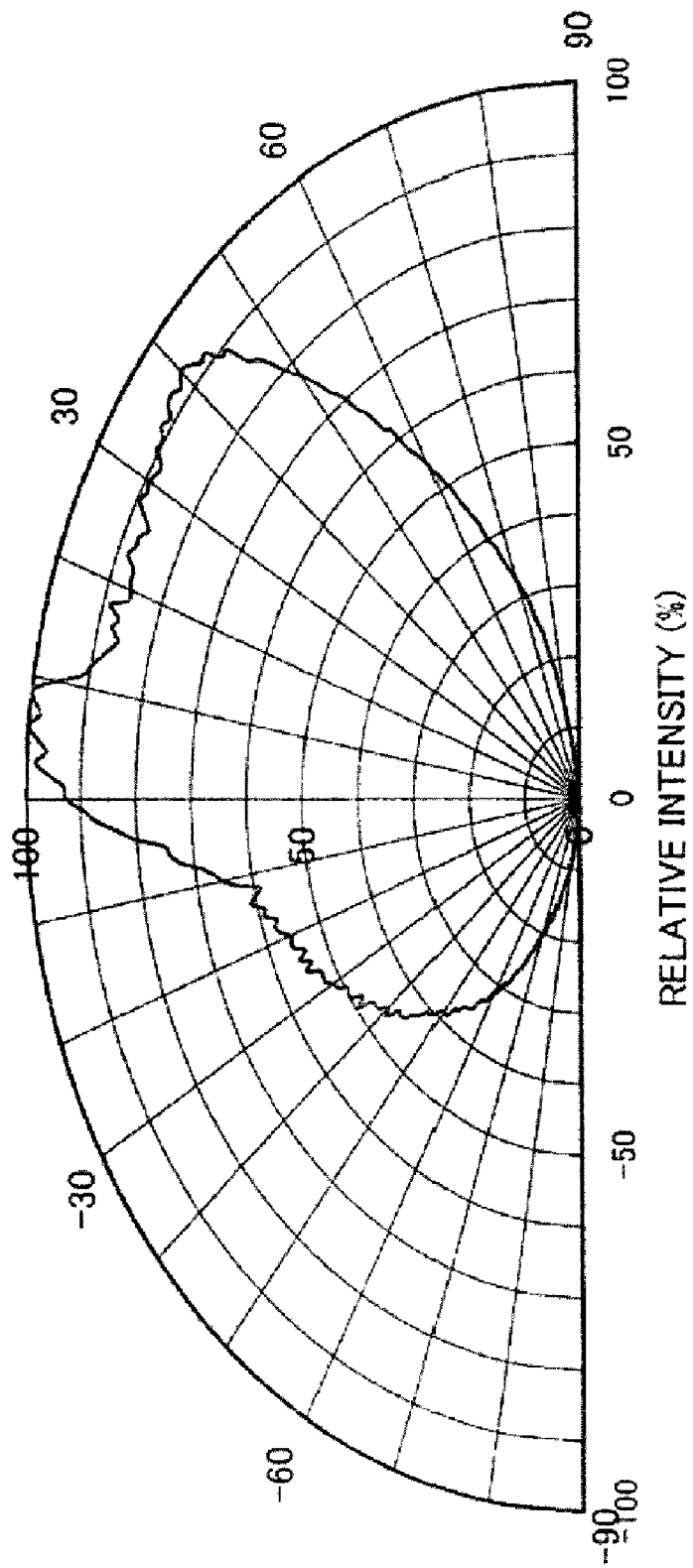
FIG. 2 is a graph showing the directional characteristics of the conventional side view type semiconductor light emitting device.
Figure 3:
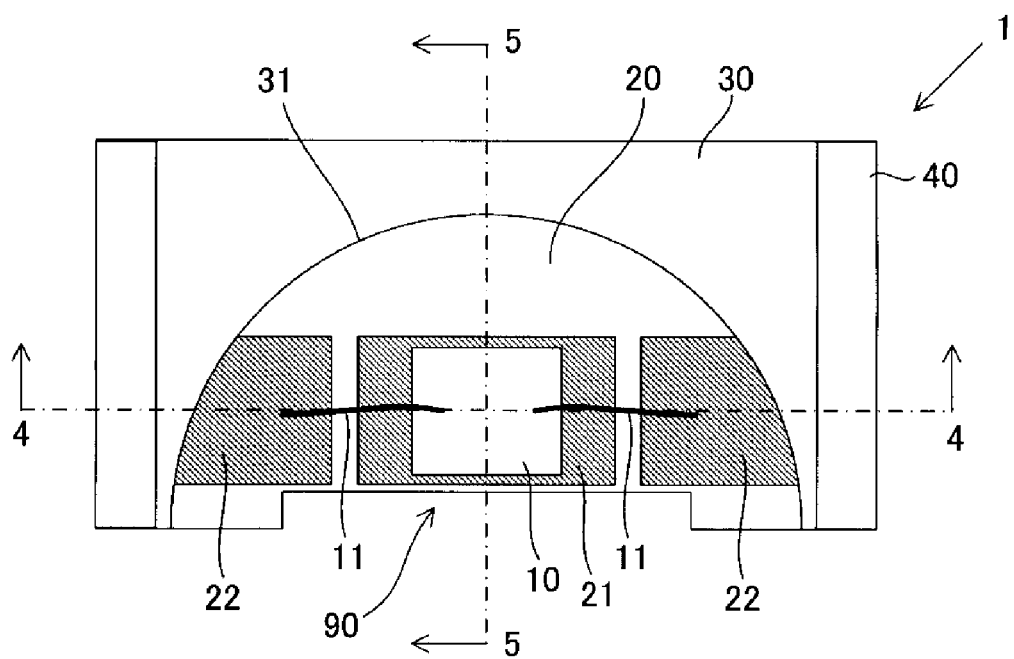
FIG. 3 is a top view of a semiconductor light emitting device made in accordance with principles of the presently disclosed subject matter.
Figure 4:
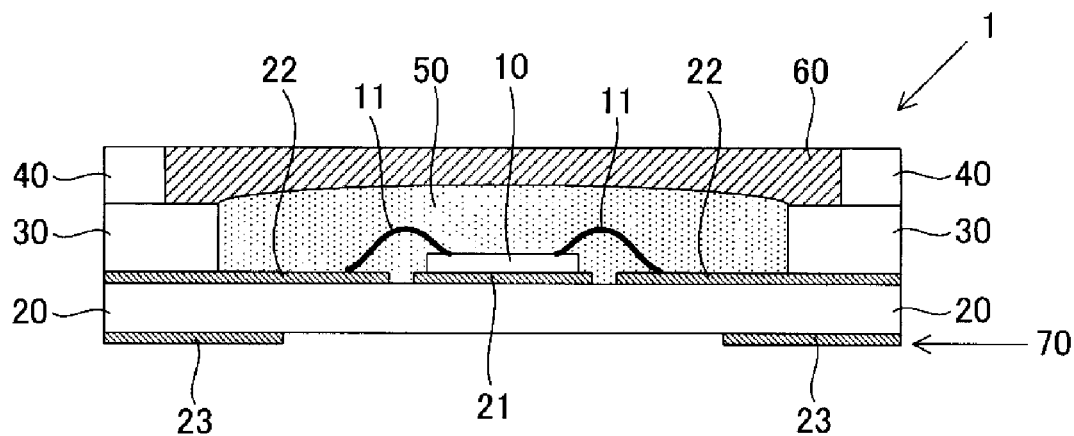
FIG. 4 is a cross sectional view taken along a line 4-4 shown in FIG. 3.
Figure 5:
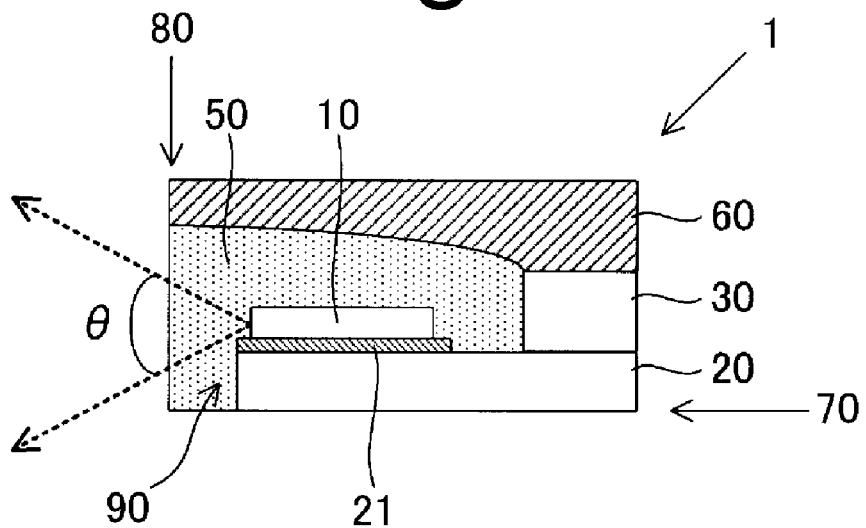
FIG. 5 is a cross sectional view taken along a line 5-5 shown in FIG. 3.

An exemplary embodiment of the presently disclosed subject matter will be described next with reference to drawings. FIGS. 3 to 5 show the structure of a semiconductor light emitting device 1 according to an exemplary embodiment of the presently disclosed subject matter with FIG. 3 being a top view, FIG. 4 being a cross sectional view taken along line 4-4 shown in FIG. 3, and FIG. 5 being a cross sectional view taken along line 5-5 shown in FIG. 3. In order to clearly show the structure of the semiconductor light emitting device 1 as viewed from above, first and second sealing resins 50 and 60 are not shown in FIG. 3.

The semiconductor light emitting device 1 of the exemplary embodiment can include an LED chip 10 that serves mainly as a light emitting element and a base substrate 20 on which the LED chip 10 is mounted. A second sealing resin 60 can be applied to cover the LED chip 10 from above to seal the LED chip 10 and other structures. Frame members 40 can be configured to define a region in which the second sealing resin 60 is to be applied. A spacer member 30 can be configured to define a space between the base substrate 20 and the second sealing resin 60, and a light-transmitting first sealing resin 50 can be applied to fill the space.

The LED chip 10 serving as a light emitting element can be a blue LED made, for example, of a GaN semiconductor, and can have a stacked structure of semiconductor films including an n-layer, a light emitting layer, and a p-layer, for example (each of which is not shown). An anode electrode and a cathode electrode (not shown) can be formed on the upper surface of the LED chip 10. An exemplary size and an exemplary thickness of the LED chip 10 can be 0.3 mm×0.3 mm, and 0.1 mm, respectively. The LED chip 10 may be mounted by soldering or a joining process using an adhesive or the like onto a die pad 21 formed on the base substrate 20. It should be noted that the LED chip 10 as described above can be utilized for a side view type semiconductor light emitting device, and accordingly, can have a light emitting direction sidewards with respect to the stacked surfaces.

The base substrate 20 can be formed by a base material made of, for example, a glass epoxy resin and a conductive pattern formed on a surface of the base material, the conductive pattern can be made of Cu foil or the like. Definition of the conductive pattern can form the die pad 21 in the central part of the base substrate 20, and bonding pads 22 on opposite sides of the die pad 21. The anode electrode and the cathode electrode on the upper surface of the LED chip 10 can be electrically connected through bonding wires 11 to the bonding pads 22. The back surface of the base substrate 20 can serve as a surface 70 on which the semiconductor light emitting device 1 is to be held when the semiconductor light emitting device 1 is mounted to a circuit board. The surface 70 can include back interconnects 23 formed thereon that are electrically connected by through holes (not shown) to the corresponding bonding pads 22. The back interconnects 23 can constitute junction parts when the semiconductor light emitting device 1 is mounted to the circuit board.

The base substrate 20 can have a cutoff portion 90 defined on the side of a light emitting surface 80 of the semiconductor light emitting device 1, namely defined forward of the LED chip 10 in a light emitting direction (out of the paper, as shown in FIG. 3). The cutoff portion 90 can be greater in length in a direction in which the cutoff portion 90 extends than the length of one side of the LED chip 10 (in the left-to-right direction in FIG. 3).

The spacer member 30 can be provided on the base substrate 20 in order to define a space between the base substrate 20 and the second sealing resin 60. The spacer member 30 can have a cutoff portion 31 that is substantially semicircular in top view as shown in FIG. 3. The spacer member 30 can be formed so that the LED chip 10 is located in the center of the cutoff portion 31. That is, the LED chip 10 may be surrounded by the spacer member 30 with an opening exposed to the light emitting surface 80. Like that of the base substrate 20, the base material for the spacer member 30 may be a glass epoxy resin. The spacer member 30 may be joined with the base substrate 20 by a commercially available adhesive sheet, for example. In light of clearance to be defined between the loop top portions of the bonding wires 11 and the second sealing resin 60, the thickness of the spacer member 30 may be set to about 0.2 mm, for example. A light reflection member such as a metal film may be arranged on the inner wall of the semicircular cutoff portion 31 of the spacer member 30. Furthermore, a material having light reflectivity such as alumina may be used as the base material of the spacer member 30.

The light-transmitting first sealing resin 50 made of a silicone resin or the like can be applied to fill a space defined on the base substrate 20 and surrounded by the spacer member 30. In this way, the LED chip 10 and the bonding wires 11 can be buried in the first sealing resin 50. The cutoff portion 90 can also be filled with the first sealing resin 50 as shown in FIG. 5. A wavelength conversion material such as a fluorescent substance may be dispersed in the first sealing resin 50. The wavelength conversion material employed herein may be a YAG:Ce fluorescent substance that is made by doping Ce (cerium) as an activator into YAG. The wavelength conversion material can absorb blue light with a peak wavelength of about 460 nm emitted from the LED chip 10, and converts the absorbed light to yellow light with a peak wavelength of about 560 nm. Then, the yellow light emitted from the wavelength conversion material and the blue light that passes through the first sealing resin 50 without being subjected to wavelength conversion are mixed together, so that white light is obtained from the light emitting surface 80. The first sealing resin 50 may also contain a light scattering material, such as silica or diamond particles, with a particle diameter of 1 to 5 µm.

Provided on the spacer member 30 are the frame members 40 as a pair that are arranged to extend along opposite side edge surfaces of the semiconductor light emitting device 1. The frame members 40 may be made of, for example, a glass epoxy resin. The frame members 40 may be joined with the spacer member 30 by a commercially available adhesive sheet. The second sealing resin 60 can be applied to fill the space defined between the two frame members 40 defining the space therebetween. The second sealing resin 60 can cover the first sealing resin 50 that can seal the LED chip 10, the bonding wires 11 and other structures. The second sealing resin 60 can also serve to prevent leakage of light from surfaces other than the light emitting surface 80. Thus, a resin material exhibiting excellence in light reflectivity can be used as a material of the second sealing resin 60. As an example, the second sealing resin 60 may be made by mixing titanium oxide power into a light-transmitting resin such as a silicone resin or the like. In this way, the LED chip 10 can be surrounded by a material of high reflectivity, by which efficiency of light extraction from the light emitting surface 80 is improved.

In the thus configured semiconductor light emitting device 1, the cutoff portion 90 can be defined in the base substrate 20. In this way, as shown in FIG. 5, the structure of the semiconductor light emitting device 1 does not have a region, in which light emitted from the LED chip 10 may be intercepted, forward of the LED chip 10 in the light emitting direction. This can place the LED chip 10 in the center of a light emitting region on the light emitting surface 80. In more detail, light emitted from the LED chip 10 can pass through the cutoff portion 90, and then exit from the light emitting surface 80 without being intercepted by the base substrate 20. Accordingly, light traveling from the LED chip 10 toward the surface 70 can be directly extracted. This can form uniform distribution of light intensity in an angle range of θ degrees with respect to the LED chip 10 as a center. Accordingly, applying the semiconductor light emitting device 1 of the presently disclosed subject matter as a light source of a backlight unit of a liquid crystal display panel can achieve substantially uniform emission of light from the main surface of a light guide plate. Furthermore, the cutoff portion 90 can be filled with the first sealing resin 50 containing a light scattering material. This can cause scattering of light passing through the cutoff portion 90, by which favorable directional characteristics can be obtained.

Figure 6:
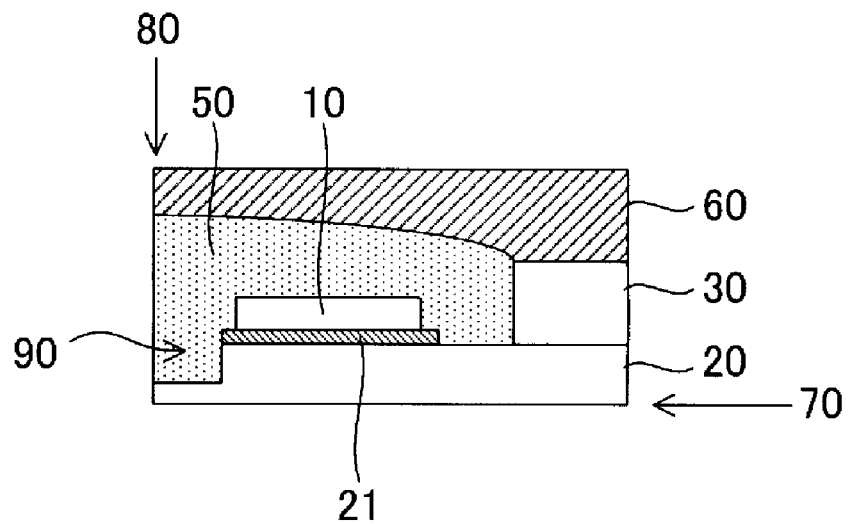
FIG. 6 is a cross sectional view of a semiconductor light emitting device according to another exemplary embodiment of the presently disclosed subject matter.

While the cutoff portion 90 can penetrate the base substrate 20 as shown in FIG. 5, an alternative formation of the cutoff portion 90 shown in FIG. 6 may be configured such that the base substrate 20 remains on its lower surface side. The shape and the dimension of the cutoff portion 90, and a region in which the cutoff portion 90 is to be defined, may suitably be changed as long as these changes achieve desirable directional characteristics.

Instead of the second sealing resin 60, a plate member such as a resin substrate or a ceramic substrate arranged so as to face the base substrate 20 with the spacer member 30 interposed therebetween may be provided to cover the upper surface of the semiconductor light emitting device 1. In this case, the plate member can be made of a material with high reflectivity at least regarding a surface contacting the first sealing resin 50.

The present exemplary embodiment includes only one light emitting surface. Alternatively, two or more surfaces that cross the surface 70 may serve as light emitting surfaces.

Figure 7:
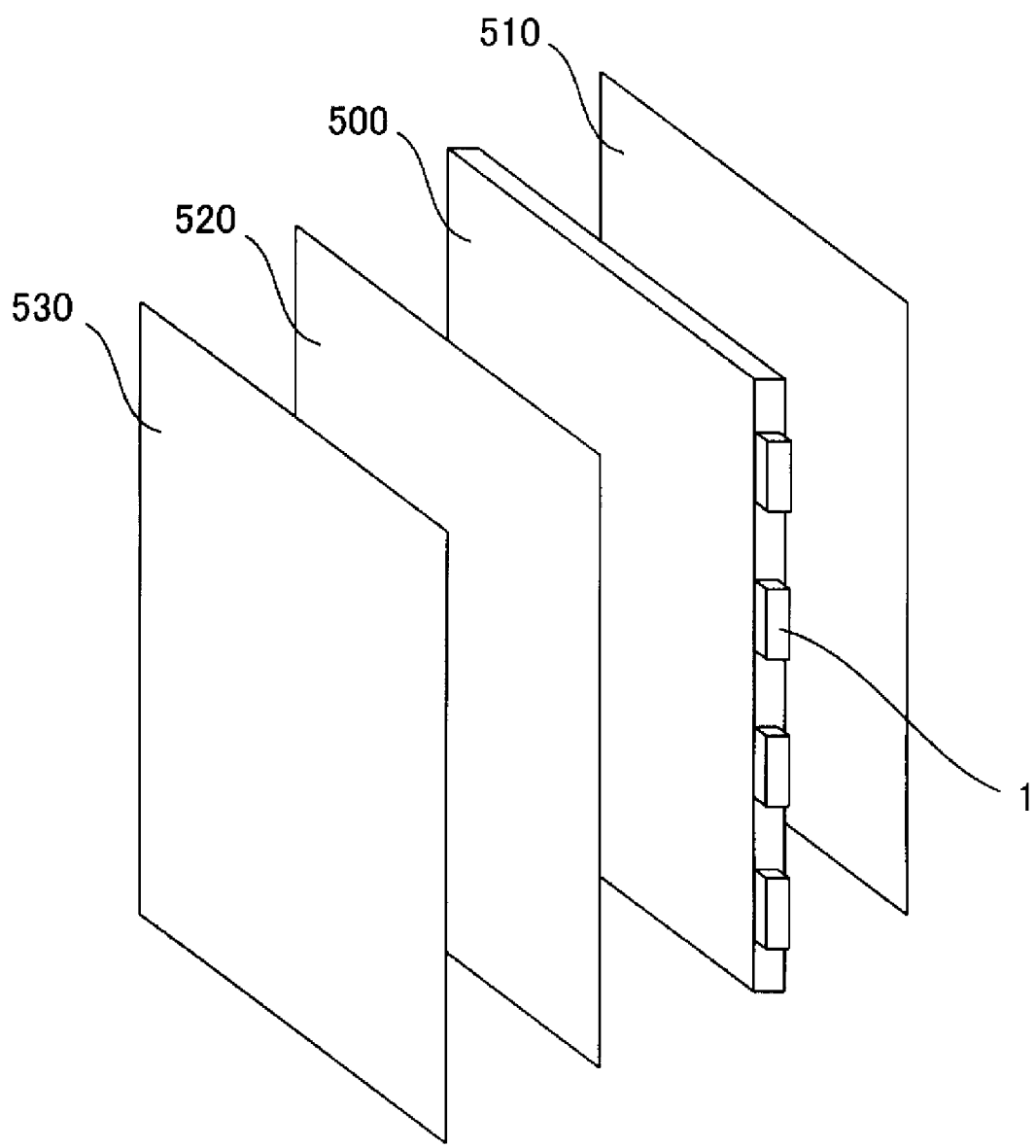
FIG. 7 is a perspective exploded view illustrating the structure of a backlight unit for use in a liquid crystal display device, the backlight unit employing an embodiment of a semiconductor light emitting device of the presently disclosed subject matter as a light source.

FIG. 7 is a perspective view of the structure of a backlight unit for use in a liquid crystal display device, and which employs an example of a semiconductor light emitting device 1 of the presently disclosed subject matter as a light source. The illustrated backlight unit can include light guide plate 500, a reflection sheet 510 provided backward of the light guide plate 500, a diffusion sheet 520 and a prism sheet 530 that are provided forward of the light guide plate 500, and a plurality of semiconductor light emitting devices 1 that are attached to one edge surface of the light guide plate 500. Light beams emitted from the semiconductor light emitting devices 1 can spread throughout the light guide plate 500. The reflection sheet 510 can reflect light from the light guide plate 500 forward (left-downward direction in FIG. 7). The diffusion sheet 520 can improve nonuniformity of intensity of light emitted from the light guide plate 500. The prism sheet 530 can provide homogeneity of intensity of light entering the prism sheet 530 from the diffusion sheet 520, and can guide the light to a liquid crystal display device arranged forward of the prism sheet 530.

Figure 8A:
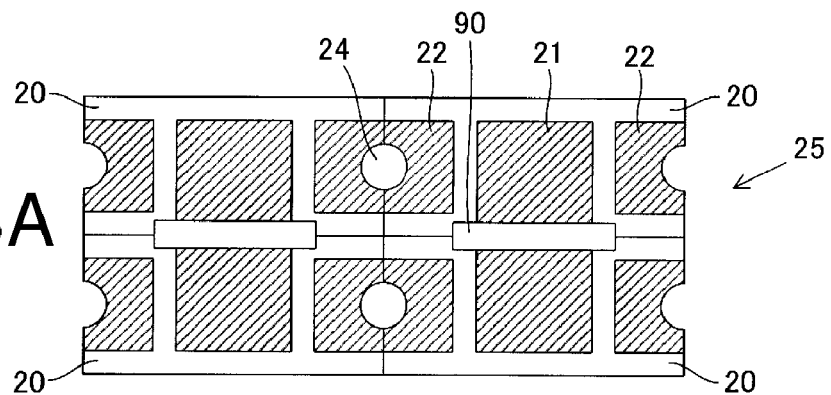
FIGS. 8A to 8D are top views of semiconductor light emitting devices in processes of manufacture according to one exemplary embodiment of the presently disclosed subject matter.
Figure 8B:
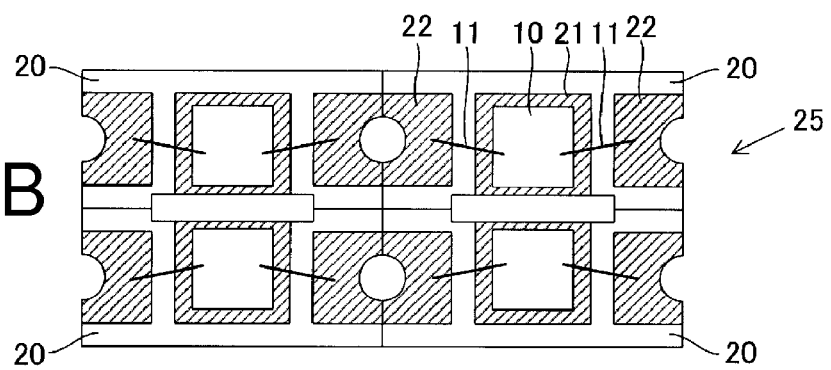
Figure 8C:
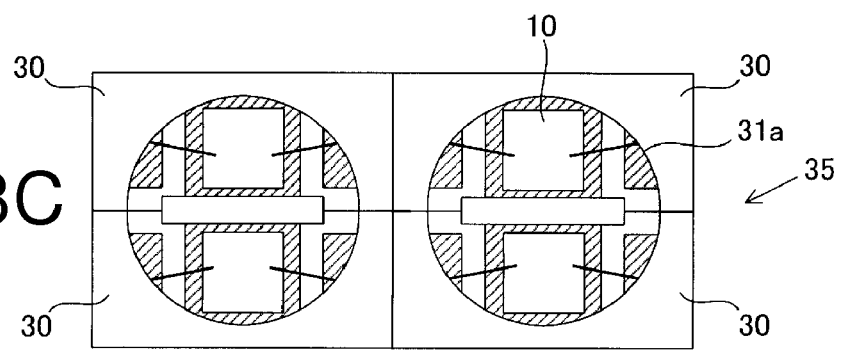
Figure 8D:
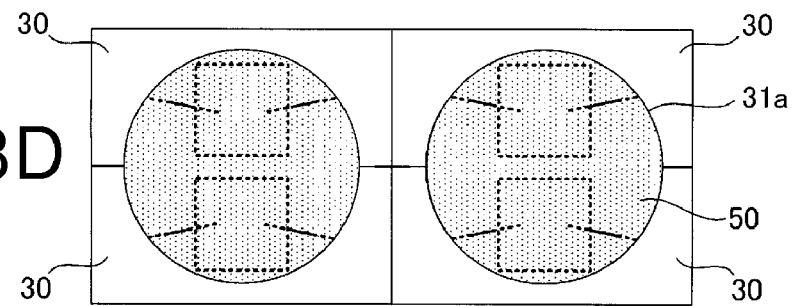
Figure 9E:
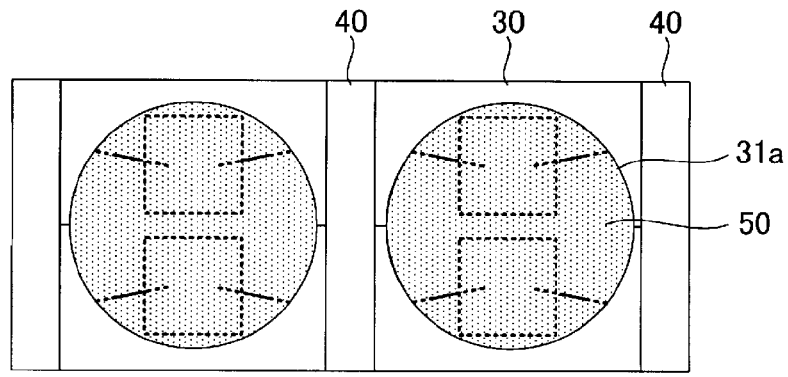
FIGS. 9E to 9G are top views of semiconductor light emitting devices in processes of manufacture according to the exemplary embodiment of the presently disclosed subject matter of FIGS. 8A-8D.
Figure 9F:
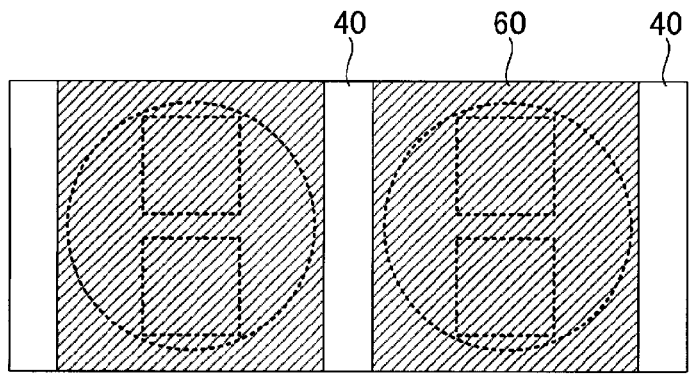
Figure 9G:
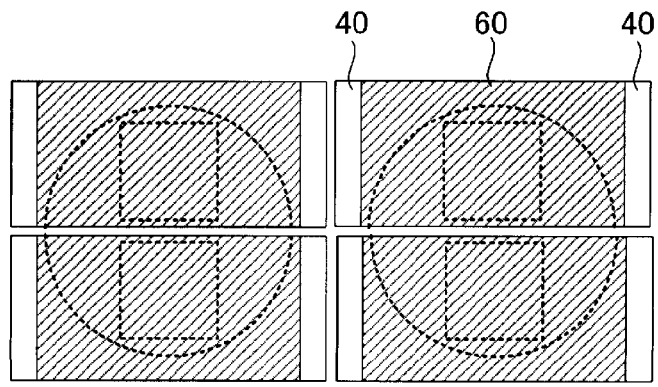
Figure 10A:
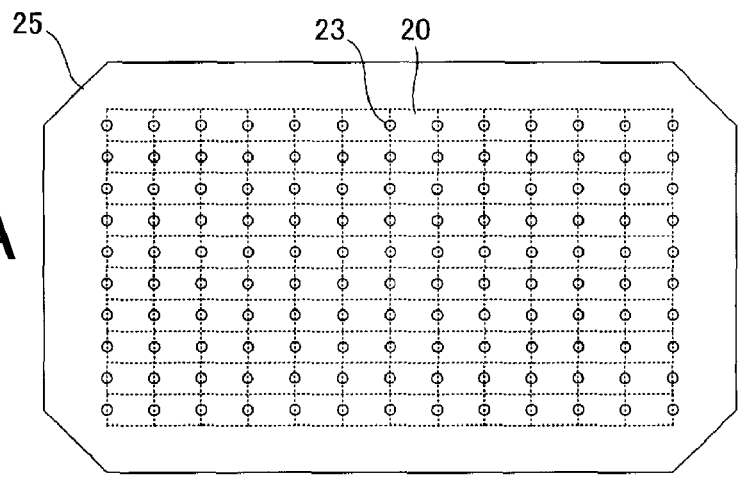
FIG. 10A is a top view illustrating a first resin substrate with a plurality of base substrates.
Figure 10B:
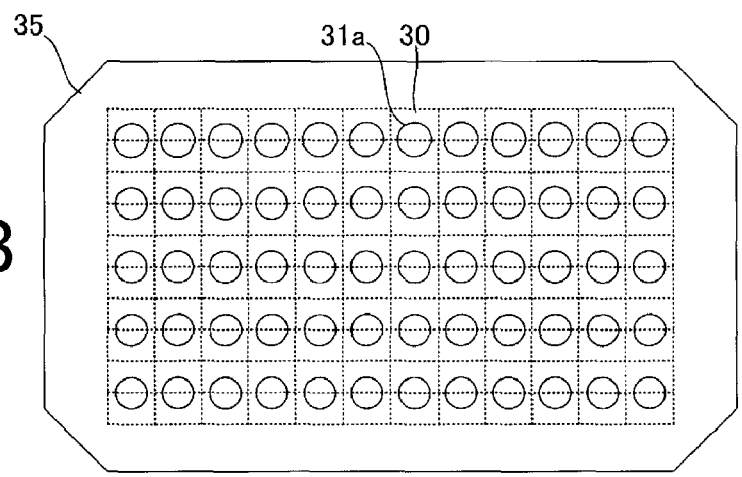
FIG. 10B is a top view illustrating a second resin substrate with a plurality of spacer members.
Figure 10C:
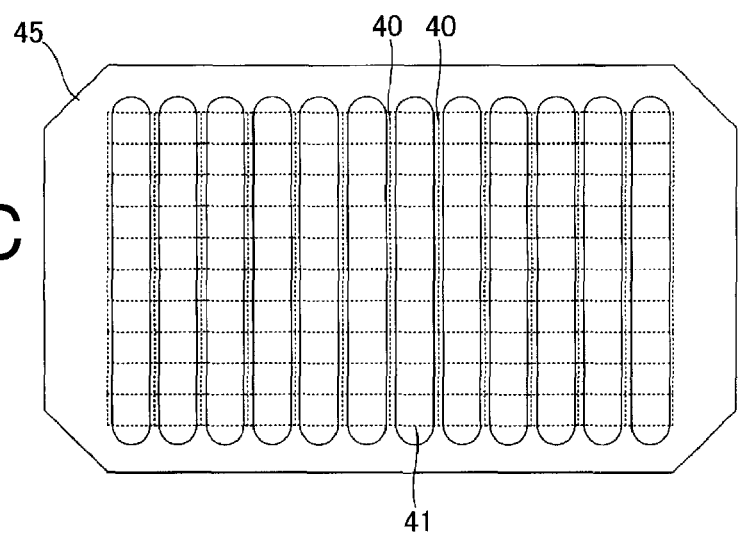
FIG. 10C is a top view illustrating a third resin substrate with a plurality of frame members.

Next, an exemplary method for manufacturing semiconductor light emitting devices 1 of the exemplary embodiment will be described with reference to FIGS. 8A to 8D, FIGS. 9E to 9G, and FIGS. 10A to 10C. FIGS. 8A to 8D and FIGS. 9E to 9G are top views of the semiconductor light emitting device 1 in processes of manufacture. FIG. 10A shows a first resin substrate 25 with a plurality of base substrates 20 used to manufacture the semiconductor light emitting devices 1. FIG. 10B shows a second resin substrate 35 with a plurality of spacer members 30. FIG. 10C shows a third resin substrate 45 with a plurality of frame members 40. In the present exemplary embodiment, a plurality of semiconductor light emitting devices 1 can be manufactured simultaneously by using the resin substrates 25, 35 and 45. FIGS. 8A to 8D and FIGS. 9E to 9G each show only four of the semiconductor light emitting devices 1 to be manufactured together.

First, the first resin substrate 25 is prepared. The first resin substrate 25 can include the plurality of integrally formed base substrates 20 arranged in a matrix (FIGS. 8A and 10A). Each of the base substrates 20 in the first resin substrate 25 can have the die pad 21 provided in the central part of the base substrate 20. The bonding pads 22 can be provided on opposite sides of the die pad 21. The bonding pads 22 can be electrically connected by through holes 24 to the back interconnects 23. A penetration hole for forming the cutoff portion 90 can be defined in each of the die pads 21. In FIG. 10A, the die pads 21, the bonding pads 22 and the cutoff portion 90 are not shown, and a boundary between adjacent ones of the base substrates 20 is indicated by dashed lines.

Next, an adhesive can be applied by a dispensing process onto the die pad 21 of each of the base substrates 20. Then, the LED chip 10 can be mounted on the die pad 21, and the applied adhesive can be cured. An anode electrode and a cathode electrode formed on the top surface of each of the LED chips 10 can be connected by the bonding wires 11 to the bonding pads 22 (FIG. 8B). Herein, it is assumed that the LED chips 10 are each a back electrode type LED chip with an anode electrode or a cathode electrode provided on its back surface. In this case, the conductive pattern of the base substrates 20 can suitably be changed in order to supply power to the LED chips 10 through the respective back interconnects 23 and the respective die pads 21. Also in this case, each of the LED chips 10 and the corresponding base substrate 20 can be joined by a conductive bonding agent such as an Ag paste or solder. Furthermore, the number of bonding wires (or other bonding structures) required is one.

The second resin substrate 35 can be prepared next. The second resin substrate 35 can include the plurality of integrally formed spacer members 30 arranged in a matrix as shown in FIG. 10B. A plurality of penetration holes 31a for forming the semicircular cutoff portions 31 of the spacer members 30 can be defined in the second resin substrate 35. In FIG. 10B, a boundary between adjacent ones of the spacer members 30 is indicated by dashed lines.

The first resin substrate 25 with the LED chips 10 mounted thereon and the second resin substrate 35 can thereafter be bonded by an adhesive sheet or the like. The bonding of the second resin substrate 35 to the first resin substrate 25 can be achieved such that two adjacent ones of the LED chips 10 mounted on the base substrates 20 and the bonding wires 11 belonging to the same base substrates 20 are exposed through the penetration holes 31a (FIG. 8C).

Then, the first sealing resin 50 made of a silicone resin or the like can be applied by a process such as dispensing so as to bury the LED chips 10 and the bonding wires 11 in the penetration holes 31a. The application of the first sealing resin 50 can be carried out such that the upper surface of the applied first sealing resin 50 has a height substantially the same as that of the upper surfaces of the spacer members 30. The applied first sealing resin 50 may be slightly greater in thickness at a portion above each of the LED chips 10 on the corresponding base substrate 20 than at other portions on the same base substrate 20, so that the applied first sealing resin 50 will be in the form of a convex in each of the base substrates 20 (FIG. 8D). This can increase the area of a light emitting surface near an optical axis, thereby improving efficiency of light extraction. Next, as shown in FIG. 10C, the third resin substrate 45 of a thickness of about 150 μm and with a plurality of pairs of frame members 40 can be prepared. A plurality of penetration slots 41 for making the frame members 40 as a pair apart from each other can be defined in the third resin substrate 45. In FIG. 10C, a boundary between the frame members 40 belonging to adjacent pairs is indicated by dashed lines. The second resin substrate 35 and the third resin substrate 45 can be thereafter bonded by an adhesive sheet or the like. The bonding of the third resin substrate 45 can be carried out such that each of the penetration holes 31a filled with the first sealing resin 50 is completely exposed in the corresponding penetration slot 41. As a result, the frame members 40 as a pair can be arranged on opposite side edge surfaces of each of the semiconductor light emitting devices 1, and a concave space with a bottom part defined by surfaces of the spacer member 30 and the first sealing resin 50 can be formed in each of the semiconductor light emitting devices 1 (FIG. 9E).

Next, the second sealing resin 60 made by mixing titanium oxide powder into a silicone resin can be applied by a process such as dispensing to fill the concave spaces formed between the frame members 40 in pairs. The application of the second sealing resin 60 can be carried out such that the upper surface of the applied second sealing resin 60 has a height that is substantially the same as that of the upper surface of the frame members 40. Further, the loop top portions of the bonding wires 11 projecting from the surface of the applied first sealing resin 50 can be buried in the second sealing resin 60 (FIG. 9F).

Then, the second sealing resin 60 can be cured, and the structure obtained by following the above-described steps can be diced into the plurality of individual semiconductor light emitting devices 1 (FIG. 9G) to complete the manufacture of the semiconductor light emitting devices 1.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting device for emitting light in a direction substantially parallel to a surface on which the semiconductor light emitting device is to be held, the semiconductor light emitting device comprising:

a semiconductor light emitting element configured to emit light in a light emitting direction substantially parallel to the surface on which the semiconductor light emitting device is to be held;

a base substrate having a substantially planar main surface on which the semiconductor light emitting element is held, the main surface being substantially parallel to the surface on which the semiconductor light emitting device is to be held, the base substrate having a cutoff portion defined forward of the semiconductor light emitting element in the light emitting direction, the cutoff portion being defined at a position where light emitted from the semiconductor light emitting element crosses a plane containing the main surface; and a light-transmitting first sealing resin provided on the base substrate, the first sealing resin configured to bury the semiconductor light emitting element and filling the cutoff portion, wherein light emitted from the semiconductor light emitting element can travel through the cutoff portion.

2. The semiconductor light emitting device according to claim 1, wherein the cutoff portion penetrates the base substrate in a direction substantially perpendicular to the light emitting direction.

3. The semiconductor light emitting device according to claim 1, wherein the cutoff portion has a length longer than one side of the semiconductor light emitting element.

4. The semiconductor light emitting device according to claim 2, wherein the cutoff portion has a length longer than one side of the semiconductor light emitting element.

5. The semiconductor light emitting device according to claim 1, wherein the semiconductor light emitting device has an end face in the light emitting direction serving as a light emitting surface, and the semiconductor light emitting element is disposed on a center axis of a light emitting region at the light emitting surface.

6. The semiconductor light emitting device according to claim 1, wherein the first sealing resin includes a wavelength conversion material.

7. The semiconductor light emitting device according to claim 1, wherein the first sealing resin includes a light scattering material.

8. The semiconductor light emitting device according to claim 1, further comprising a second sealing resin provided on or adjacent to the first sealing resin.

9. The semiconductor light emitting device according to claim 2, further comprising a second sealing resin provided on or adjacent to the first sealing resin.

10. The semiconductor light emitting device according to claim 3, further comprising a second sealing resin provided on or adjacent to the first sealing resin.

11. The semiconductor light emitting device according to claim 4, further comprising a second sealing resin provided on or adjacent to the first sealing resin.

12. The semiconductor light emitting device according to claim 5, further comprising a second sealing resin provided on or adjacent to the first sealing resin.

13. The semiconductor light emitting device according to claim 6, further comprising a second sealing resin provided on or adjacent to the first sealing resin.

14. The semiconductor light emitting device according to claim 7, further comprising a second sealing resin provided on or adjacent to the first sealing resin.

15. The semiconductor light emitting device according to claim 8, wherein the second sealing resin has a light reflectance property.

16. A semiconductor light emitting device for emitting light in a direction substantially parallel to a surface on which the semiconductor light emitting device is to be held, the semiconductor light emitting device comprising:

a semiconductor light emitting element configured to emit light in a light emitting direction substantially parallel to the surface on which the semiconductor light emitting device is to be held;

a base substrate having a top surface on which the semiconductor light emitting element is mounted, and a back surface serving as the surface on which the semiconductor light emitting device is to be held;

a first sealing resin configured to seal the semiconductor light emitting element;

a spacer member provided to partially surround the first sealing resin; and a second sealing resin configured to cover the semiconductor light emitting element, the first sealing resin and the spacer member from above, wherein the first sealing resin includes a light emitting surface defined by the base substrate, the spacer member and the second sealing resin, the light emitting surface extending in a direction substantially perpendicular to the surface on which the semiconductor light emitting device is to be held, wherein a cutoff portion is defined in part of an edge of the base substrate, the edge defining the light emitting surface.

17. A backlight unit for a liquid crystal display device, comprising the semiconductor light emitting device according to claim 1.

18. A backlight unit for a liquid crystal display device, comprising the semiconductor light emitting device according to claim 2.

19. A backlight unit for a liquid crystal display device, comprising the semiconductor light emitting device according to claim 3.

20. A backlight unit for a liquid crystal display device, comprising the semiconductor light emitting device according to claim 4.

21. A backlight unit for a liquid crystal display device, comprising the semiconductor light emitting device according to claim 8.

22. A backlight unit for a liquid crystal display device, comprising the semiconductor light emitting device according to claim 16.

23. A method for manufacturing a semiconductor light emitting device, comprising:

preparing a die pad, and a base substrate having a cutoff portion defined close to the die pad;

mounting a semiconductor light emitting element onto the die pad;

fixedly providing a spacer on the base substrate to substantially surround the semiconductor light emitting element;

applying a light-transmitting resin to fill a space around the semiconductor light emitting element;

fixedly providing a frame member on the spacer; and applying a sealing resin to fill a space surrounded by the frame member, the light-transmitting resin, the spacer, and atmospheric air.

24. The semiconductor light emitting device according to claim 1, wherein the cutoff portion penetrates entirely through the base substrate.

* * * * *